United States Patent
Khalid et al.

(10) Patent No.: US 9,412,556 B2
(45) Date of Patent: Aug. 9, 2016

(54) TRANSMISSION ELECTRON MICROSCOPE CELLS FOR USE WITH LIQUID SAMPLES

(71) Applicants: Waqas Khalid, Berkeley, CA (US); A. Paul Alivisatos, Berkeley, CA (US); Alexander K. Zettl, Kensington, CA (US)

(72) Inventors: Waqas Khalid, Berkeley, CA (US); A. Paul Alivisatos, Berkeley, CA (US); Alexander K. Zettl, Kensington, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 14/524,866

(22) Filed: Oct. 27, 2014

(65) Prior Publication Data

US 2015/0118126 A1    Apr. 30, 2015

Related U.S. Application Data

(60) Provisional application No. 61/898,361, filed on Oct. 31, 2013.

(51) Int. Cl.

| | | |
|---|---|---|
| *H01J 37/16* | (2006.01) | |
| *H01L 29/66* | (2006.01) | |
| *H01J 37/20* | (2006.01) | |
| *H01J 37/26* | (2006.01) | |
| *H01L 29/78* | (2006.01) | |
| *H01L 29/16* | (2006.01) | |
| *C23C 18/08* | (2006.01) | |

(52) U.S. Cl.
CPC ............. *H01J 37/20* (2013.01); *H01J 37/26* (2013.01); *C23C 18/08* (2013.01); *H01J 37/16* (2013.01); *H01J 2237/2003* (2013.01); *H01J 2237/204* (2013.01); *H01L 29/1606* (2013.01); *H01L 29/66045* (2013.01); *Y10T 29/49002* (2015.01)

(58) Field of Classification Search
None
See application file for complete search history.

(56) References Cited

U.S. PATENT DOCUMENTS

| 8,059,271 B2 | 11/2011 | Marsh et al. | |
|---|---|---|---|
| 8,102,523 B1 | 1/2012 | Marsh et al. | |
| 2011/0309336 A1* | 12/2011 | Shin | B82Y 10/00 257/29 |
| 2012/0107562 A1* | 5/2012 | Bolotin | B81C 1/00595 428/156 |
| 2012/0326115 A1* | 12/2012 | Choi | H01L 21/02381 257/9 |
| 2013/0105765 A1* | 5/2013 | Haensch | H01L 29/42364 257/29 |
| 2013/0193412 A1* | 8/2013 | Lee | H01L 21/6835 257/29 |
| 2014/0253996 A1* | 9/2014 | Burdis | G02F 1/155 359/265 |

OTHER PUBLICATIONS

De Boer et al., "Micromachining of Buried Micro Channels in Silicon," Journal of Microelectromechanical Systems, vol. 9, No. 1, Mar. 2000, pp. 94-103.

(Continued)

*Primary Examiner* — Jennifer Wecker
(74) *Attorney, Agent, or Firm* — Lawrence Berkeley National Laboratory

(57) ABSTRACT

This disclosure provides systems, methods, and devices related to transmission electron microscopy cells for use with liquids. In one aspect a device includes a substrate, a first graphene layer, and a second graphene layer. The substrate has a first surface and a second surface. The first surface defines a first channel, a second channel, and an outlet channel. The first channel and the second channel are joined to the outlet channel. The outlet channel defines a viewport region forming a though hole in the substrate. The first graphene layer overlays the first surface of the substrate, including an interior area of the first channel, the second channel, and the outlet channel. The second graphene layer overlays the first surface of the substrate, including open regions defined by the first channel, the second channel, and the outlet channel.

20 Claims, 5 Drawing Sheets

(56) References Cited

OTHER PUBLICATIONS

Klein et al., "Transmission electron microscopy with a liquid flow cell," Journal of Microscopy, vol. 242, Pt 2 2011, pp. 117-123.
De Jonge et al., "Electron microscopy of specimens in liquid," Nature Nanotechnology, vol. 6, Nov. 2011, pp. 695-704.
Chen et al., "3D Motion of DNA-Au Nanoconjugates in Graphene Liquid Cell Electron Microscopy," Nano Lett. 2013, 13, pp. 4556-4561.
Chappanda et al., "Novel Graphene Bridge for NEMS based Devices," 2011 IEEE Sensors Proceedings, Oct. 28-31, 2011, pp. 1358-1361.
Frank et al., "Mechanical properties of suspended graphene sheets," J. Vac. Sci. Technol. B 25(6), Nov./Dec. 2007, pp. 2558-2561.
Yuk et al., "High-Resolution EM of Colloidal Nanocrystal Growth Using Graphene Liquid Cells," Science 336, 61 (2012).

* cited by examiner

TRANSMISSION ELECTRON MICROSCOPE CELLS FOR USE WITH LIQUID SAMPLES

RELATED APPLICATIONS

This application claims priority to U.S. Provisional Patent Application No. 61/898,361, filed Oct. 31, 2013, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to sample holders for transmission electron microscopy (TEM) and more particularly to sample holders for in situ liquid TEM.

BACKGROUND

There is an ever increasing need to understand matter at the nanoscale. For example, some scientists are developing new tools to observe individual atoms interacting with each other during chemical reactions. One way in which scientists attempt to observe individual atoms interacting with each other during chemical reactions is imaging liquid reactants using a transmission electron microscope (TEM).

SUMMARY

Embodiments disclosed herein describe a TEM cell for use with liquid samples and methods of fabrication thereof. In some embodiments, the TEM cell combines microfluidics with a liquid TEM chamber, using graphene as a viewport for the liquid TEM chamber. In some embodiments, the fabrication process for the TEM cell has an advantage of sealing the microfluidics of the cell without the bonding of two separate membranes, which can lead to leakage of a liquid and other issues.

One innovative aspect of the subject matter described in this disclosure can be implemented in a device including a substrate, a first graphene layer, and a second graphene layer. The substrate has a first surface and a second surface, the first surface defining a first channel, a second channel, and an outlet channel. The first channel and the second channel are joined to the outlet channel. The outlet channel defines a viewport region forming a though hole in the substrate. The first graphene layer overlays the first surface of the substrate, including an interior area of the first channel, the second channel, and the outlet channel. The second graphene layer overlays the first surface of the substrate, including open regions defined by the first channel, the second channel, and the outlet channel. The first graphene layer and the second graphene layer define an open volume in the first channel, the second channel, and the outlet channel between the first and the second graphene layers.

In some embodiments, the first channel includes a first inlet for a flow of a first liquid to the device. The second channel includes a second inlet for a flow of a second liquid to the device. The outlet channel includes outlet for a flow of a mixture of the first liquid and the second liquid from the device. In some embodiments, dimensions of the viewport region allow the first graphene layer and the second graphene layer to be mechanically stable.

In some embodiments, a dielectric layer is disposed on the first surface of the substrate, including the first channel, the second channel, and the outlet channel. In some embodiments, the dielectric layer is selected from a group consisting of silicon dioxide, silicon nitride, and aluminum oxide. In some embodiments, the dielectric layer is about 5 nanometers to 500 nanometers thick.

In some embodiments, a catalyst layer overlays the dielectric layer. In some embodiments, the catalyst layer comprises copper and is about 250 nanometers to 500 nanometers thick. In some embodiments, the catalyst layer comprises nickel and is at least about 300 nanometers thick. In some embodiments, a buffer layer is disposed on the dielectric layer, and the catalyst layer is disposed on the buffer layer. In some embodiments, the buffer layer comprises alumina.

In some embodiments, the substrate comprises a semiconductor substrate. In some embodiments, the first channel, the second channel, and the outlet channel have cross-sectional dimensions of about 10 nanometers to 100 microns. In some embodiments, the though hole in the substrate has dimensions of about 250 nanometers to 750 nanometers.

Another innovative aspect of the subject matter described in this disclosure can be implemented in a device including a substrate, a first graphene layer, and a second graphene layer. The substrate has a first surface and a second surface, the first surface defining a first channel and an outlet channel. The first channel is joined to the outlet channel. The outlet channel defines a viewport region forming a though hole in the substrate. The first graphene layer overlays the first surface of the substrate, including an interior area of the first channel and the outlet channel. The second graphene layer overlays the first surface of the substrate, including open regions defined by the first channel and the outlet channel. The first graphene layer and the second graphene layer define an open volume in the first channel and the outlet channel between the first and the second graphene layers.

In some embodiments, the first channel includes a first inlet for a flow of a liquid to the device, and the outlet channel includes outlet for a flow of the liquid from the device.

Another innovative aspect of the subject matter described in this disclosure can be implemented in a method including: depositing a first dielectric layer on a first surface of a substrate; patterning the first dielectric layer; etching the first surface of the substrate to define a first channel, a second channel, and an outlet channel; depositing a second dielectric layer in the first channel, the second channel, and the outlet channel; depositing a catalyst layer over the first and the second dielectric layers; growing a first graphene layer on the catalyst layer; etching a second surface of the substrate, etching the second dielectric layer, and etching the catalyst layer in a viewport region of the outlet channel to expose the first graphene layer; positioning a second graphene layer to overlay the first surface of the substrate, the first graphene layer and the second graphene layer defining an open volume in the first channel, the second channel, and the outlet channel between the first and the second graphene layers.

In some embodiments, the method further comprises depositing a buffer layer on the first and the second dielectric layers, with the catalyst layer being deposited on the buffer layer. The buffer layer is etched after etching the second surface of the substrate and the second dielectric layer, and then the catalyst layer is etched.

In some embodiments, etching the second surface of the substrate includes a dry etching process. In some embodiments, etching the second dielectric layer and etching the catalyst layer include wet etching processes.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

DETAILED DESCRIPTION

Figure 1:
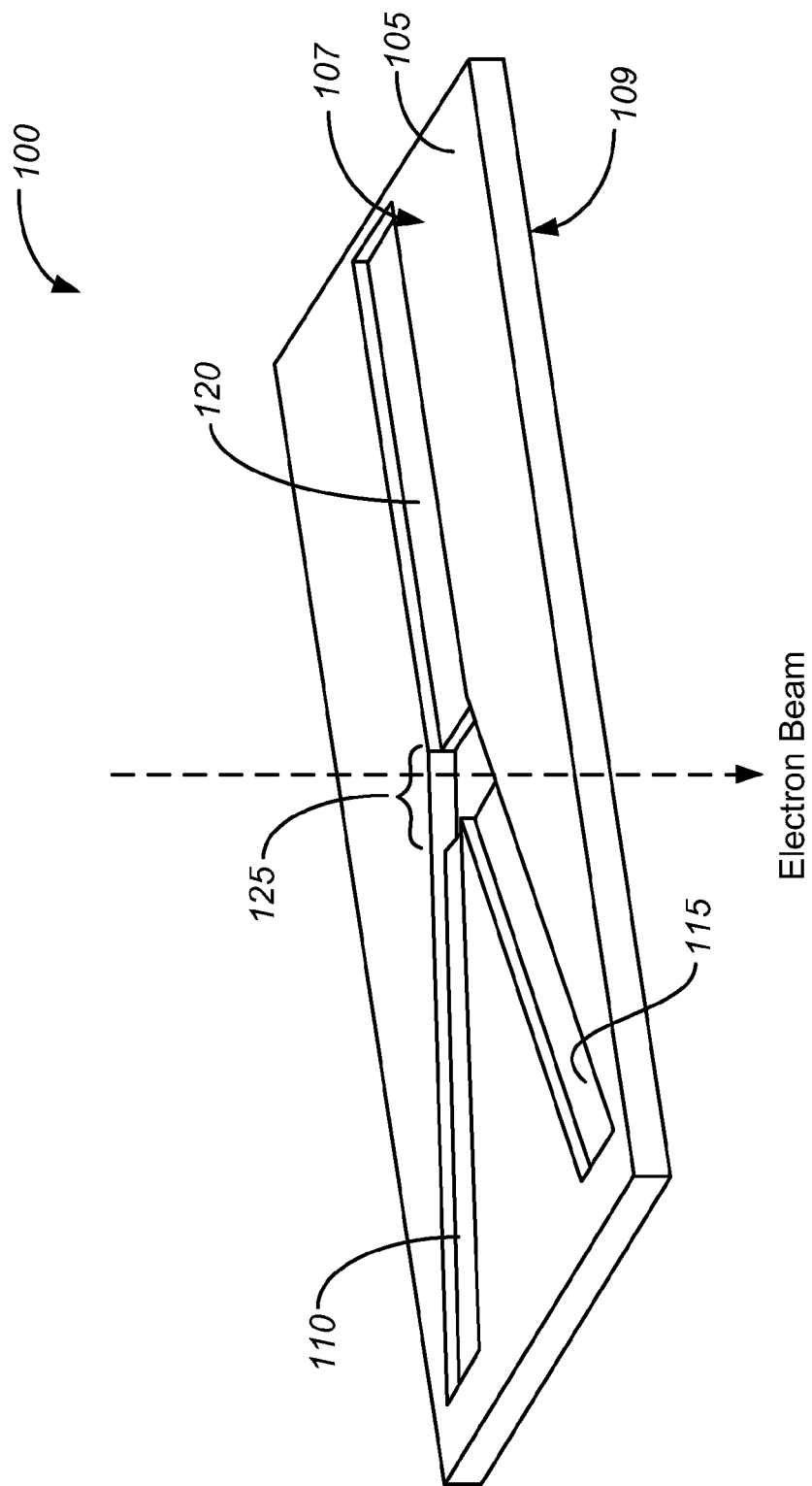
FIG. 1 shows an example of an isometric illustration of a TEM cell.

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

INTRODUCTION

In recent years, many advances have been made in the field of liquid transmission electron microscopy (TEM). Researchers are constantly trying to improve ways of studying nanomaterials with molecular resolution in solutions, study chemical reactions in situ with atomic resolution, understand the interaction of biomolecules with each other and other nano particles, etc. A fundamental challenge in such efforts is the design and fabrication of a sample holder that is robust enough to allow for liquid flow in an ultra-high vacuum chamber, yet having walls that are thin enough to allow high resolution imaging of molecules in the liquid.

Several reports have been published on TEM holders that allow imaging of nanomaterials in solution. Several commercially available TEM holders with integrated chips also are available that allow researchers to study nanomaterials at lower resolutions. The reason for the limitation in resolution comes from the thicknesses of the membrane walls that hold the liquid. In other words, the thicknesses of the walls of the microchannels that allow for fluid flow in a TEM limit the imaging resolution that can be achieved using such devices.

Recently, graphene based liquid TEM pockets have been demonstrated that allow high resolution imaging of nanomaterials in various solutions. Integrating graphene with micro/nano fluidics that can withstand ultra-high vacuum environments is a challenge; this technique is thus far limited to the study of nanomaterials that are trapped in the liquid pockets between two graphene sheets.

A device is disclosed herein that integrates micro/nano fluidics with graphene windows or "viewports" that allow for the realization of a liquid TEM cell capable of delivering several solutions in a TEM column under ultrahigh vacuum and allow high resolution imaging of nanomaterials. Also disclosed herein are fabrication methods for such a device.

Device

FIG. 1 shows an example of an isometric schematic illustration of a TEM cell (i.e., a flow cell for TEM applications). The TEM cell 100 includes a substrate 105 and graphene layers (not shown). The substrate 105 has a first surface 107 and a second surface 109. The first surface 107 of the substrate defines a first channel 110, a second channel 115, and an outlet channel 120. The outlet channel 120 defines a viewport region 125 forming a though hole in the substrate. In some embodiments, the first channel 110 includes a first inlet (not shown) for a flow of a first liquid to the TEM cell 100, the second channel 115 includes a second inlet (not shown) for a flow of a second liquid to the TEM cell 100, and the outlet channel 120 includes an outlet (not shown) for a flow of a mixture of the first liquid and the second liquid out of the TEM cell 100. With the TEM cell 100, the reaction of species in the first liquid and species in the second liquid can be observed in a TEM as the two liquids mix in the viewport region 125.

In some embodiments, the first channel 110, the second channel 115, and the outlet channel 120 have cross-sectional dimensions of about 10 nanometers (nm) to 100 microns. For example, when the channels have a square or rectangular cross section, the cross-sectional dimensions may be about 10 nm to 100 microns by about 10 nm to 100 microns. When the channels have a circular cross section, the cross-sectional diameter of the channels may be about 10 nm to 100 microns. In some embodiments, the channels have a width (i.e., with respect to the first surface 107 of the substrate 105) of about 10 nm to 100 microns. In some embodiments, the channels may have a depth in the substrate 105 of about 3 nm to 300 microns, or about 300 nm to 100 microns.

In some embodiments, the viewport region 125 defining the though hole in the substrate 105 (i.e., the area of the viewport region 125 with respect to the first surface 107 of the substrate 105) is about 10 nm to 50 microns by about 10 nm to 50 microns. In some embodiments, the viewport region defining the though hole in the substrate has dimensions of about 250 nm to 750 nm by about 250 nm to 750 nm, or about 500 nm by 500 nm. In some embodiments, the viewport region defining the though hole in the substrate has dimensions of about 100 nm to 250 nm by about 100 nm to 250 nm.

To aid in preventing liquids from flowing out of the TEM cell 100, apart from flowing into the first channel 110 and the second channel 115 and out of the outlet channel 120, a first graphene layer overlays the viewport region 125 including the interior area of the viewport region 125 and a second graphene layer overlays the open regions on the first surface 107 of the substrate 105 due to the first channel 110, the second channel 115, and the outlet channel 120. In some embodiments, the first graphene layer and the second graphene layer are positioned to seal the through hole of the viewport region 125 of the substrate 105 to flow of the first liquid and the second liquid. That is, the first and the second graphene layers may seal the channels of the TEM cell 100 such that liquids may flow into the first channel 110 and the second channel 115 and out the outlet channel 120, but the liquids do not flow out of the though hole in the first surface 107 and the second surface 109 of the substrate 105. In some embodiments, the first graphene layer and the second graphene layer each have a thickness of about an atomic layer of carbon. In some embodiments, the first graphene layer and the second graphene layer each have a thickness of about an atomic layer (e.g., for a single atomic layer of carbon) to 100 nm (e.g., for a multilayer graphene sheet). In some embodiments, the first graphene layer and/or the second graphene layer comprise a single graphene layer. In some embodiments, the first graphene layer and/or the second graphene layer comprise a multilayer graphene layer. In some embodiments, the viewport region may be small so that the first graphene layer and the second graphene layer remain mechanically stable.

In a manufacturing process for the TEM cell 100, a first graphene layer may be grown such that it overlays the first surface 107 of the substrate 105, including an interior area of the first channel 110, the second channel 115, and the outlet channel 120. Thus, the first graphene layer may not be a planar graphene layer, but instead conform to the first surface 107 of the substrate 105 and the interior areas of the channels formed in the first surface 107 of the substrate 105.

A second graphene layer may be grown (e.g., not on the first surface 107 of the substrate 105, but on a different substrate) and then positioned such that the second graphene layer overlays the first surface 107 of the substrate 105, including open regions defined by the first channel 110, the second channel 115, and the outlet channel 120. Thus, the second graphene layer may be a substantially planer graphene layer, and not conform to the interior areas of the channels formed in the first surface 107 of the substrate 105.

In some embodiments, the first graphene layer and the second graphene layer define an open volume in the first channel 110, the second channel 115, and the outlet channel 120 between the first and the second graphene layers. In some embodiments, the first graphene layer and the second graphene layer bound or seal the through hole of the viewport region 125 of the substrate 105. In some embodiments, the open volume defined in the viewport region 125 of the outlet channel 120 includes only the second graphene layer at the top of the viewport region 125 and the first graphene layer at the bottom of the viewport region 125. This may allow an electron beam to pass through a liquid sample contained in the viewport region 125 while only additionally passing through the first graphene layer and the second graphene layer. That is, the electron beam may only interact with the first graphene layer, the second graphene layer, and a liquid in the viewport region 125, and not interact with any other materials or components of the TEM cell 100. A process for achieving such a configuration is described further below in the METHODS section.

In some embodiments, the substrate comprises a semiconductor substrate. In some embodiments, the substrate comprises a silicon (Si) substrate. In some embodiments, the substrate is about 200 microns to 3 millimeters (mm) thick, or about 500 microns thick. The substrate may also comprise other materials, such as a glass, quartz, or another material that can be subjected to elevated temperatures, for example.

The TEM cell 100 may include a number of additional layers of material disposed on the first surface 107 of the substrate 105, including the interior areas of the first channel 110, the second channel 115, and the outlet channel 120, to aid in the fabrication process of the TEM cell 100 or to aid in the operation of the TEM cell 100.

For example, in some embodiments, a dielectric layer is disposed on the first surface 107 of the substrate 105, including the interior areas of the first channel 110, the second channel 115, and the outlet channel 120. In some embodiments, the dielectric layer is selected from a group consisting of silicon dioxide, silicon nitride, and aluminum oxide. In some embodiments, the dielectric layer is about 5 nm to 500 nm thick.

In some embodiments, a catalyst layer is disposed on or overlays the dielectric layer. The catalyst layer may serve to aid in the growth of the first graphene layer on the first surface 107 of the substrate 105, including the interior area of the first channel 110, the second channel 115, and the outlet channel 120. In some embodiments, the catalyst layer comprises copper and is about 250 nanometers to 500 nanometers thick. In some embodiments, the catalyst layer comprises nickel and is at least about 300 nanometers thick.

In some embodiments, a buffer layer is disposed on the dielectric layer, with the catalyst layer being disposed on the buffer layer. In some embodiments, the buffer layer comprises alumina. In some embodiments, the buffer layer is about 2.5 nm to 7.5 nm thick, or about 5 nm thick.

While the TEM cell 100 has three channels, the first channel 110, the second channel 115, and the outlet channel 120, a TEM cell may be fabricated having any number of inlet channels and outlet channels. For example, in some embodiments, a TEM cell includes one inlet channel and one outlet channel. In some embodiments, a TEM cell includes three inlet channels and one outlet channel. The configuration may depend on a specified mixing pattern of the liquids that are to be flowed into the TEM cell. A TEM cell also may be fabricated having a plurality of viewport regions. Multiple viewport regions may allow for the characterization of a chemical reaction from the beginning of the reaction where constituents first meet, though the intermediate stages of the reaction, to the completion of the reaction. With the ability of specify the dimensions of the channels in a TEM cell, a TEM cell could also be fabricated for analyzing biomolecules and biological samples, including cells, in-situ using a TEM, without using conventional cryotechniques.

Further, many additional components could be included in a TEM cell, including membranes, electrodes, and heaters. Membranes could be used to change or vary the dimensions of a channel or channels. Electrodes (e.g., micro- or nano-electrodes) could be used to apply a potential to a sample or to electrically stimulate a sample. Heaters (e.g., micro- or nano-heaters) could be used to control the temperature of a sample in situ.

Figure 2A:
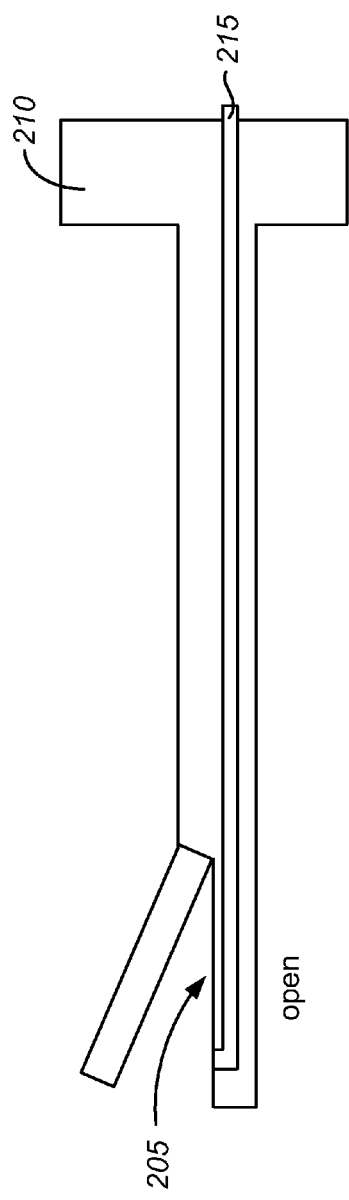
FIGS. 2A-2C show examples of isometric schematic illustrations of a TEM cell and the integration of the TEM cell in a TEM sample holder.
Figure 2B:
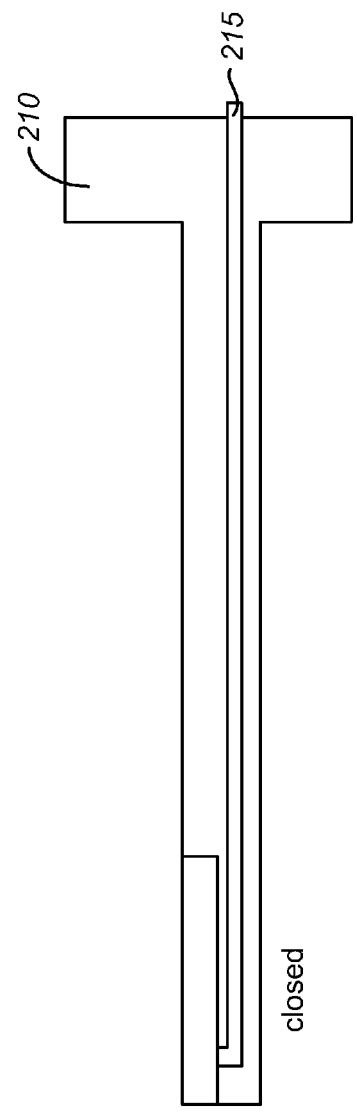
Figure 2C:
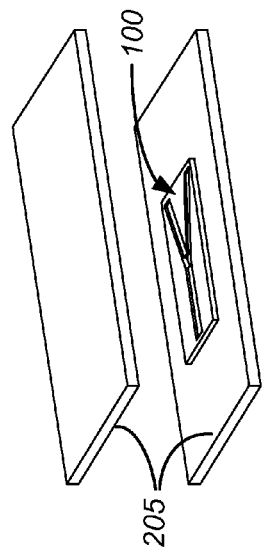

FIGS. 2A-2C show examples of isometric schematic illustrations of a TEM cell and the integration of the TEM cell in a TEM sample holder. The TEM cell may be any number of different configurations of a TEM cell. As shown in FIG. 2C, the TEM cell is a TEM cell 100, as described with respect to FIG. 1. FIG. 2C shows the TEM cell 100 placed in a holder 205. The holder 205 can be placed in a TEM sample holder 210 (see FIGS. 2A and 2B). The TEM cell 100, the holder 205, and the TEM sample holder 210 may include features (e.g., protrusions and depressions) that allows for alignment of each component with the other components. The TEM sample holder 210 includes a plurality of ports 215 for liquids to flow to and from the TEM cell 100. The TEM sample holder 210 may include other features that allow for integration of the TEM sample holder 210 in a TEM for observation of samples in the TEM.

FIG. 2A shows the TEM sample holder 210 in an open position, in which the holder 205 including the TEM cell 100 can be inserted and removed from the TEM sample holder 210. FIG. 2B shows the TEM sample holder 210 in closed position in which the TEM sample holder 210 is ready for insertion into a TEM. The holder 205 may be sealed in the TEM sample holder 210 using an adhesive, such as a temperature activated vacuum compatible epoxy, for example. Other mounting hardware, such as nuts, bolts, and screws may be used in the assembly of the holder 205 and portion of the TEM sample holder 210 configured to accept the holder 205. The design of the TEM sample holder 210 may allow for the TEM sample holder 210 to be reusable, while the TEM cell 100 may be a disposable consumable. Liquids may be flowed into the TEM cell 100 with a pump or pumps located outside of the TEM column.

While the TEM cell 100 is described with respect to use in a TEM, a device including two graphene windows that allows for transmission of radiation through the windows and a liquid sample may be fabricated for use in other experimental or characterization apparatus that employ a vacuum chamber in which a liquid sample is to be analyzed. For example, such a device could be used in transmission x-ray microscopy, x-ray photoelectron spectroscopy (XPS), scanning electron microscopy (SEM), secondary ion mass spectroscopy (SIMS), and x-ray diffraction (XRD).

A device including two graphene windows that allows for transmission of radiation through the windows can also be used with various optical characterization techniques, including other types of microscopy and techniques for the analysis of micro-biological samples stained with florescent tags. For example, embodiments of the TEM cell may be used in conjunction with optical microscopy or near field optical microscopy, either in the transmission mode or reflection mode, due to the optical transparency of the materials of the TEM cell. This may provide the capability of performing correlative studies of biological samples with florescent tags using optical microscopy and electron microscopy and generate more detailed information regarding the structure, conformation, and dynamics of the biological samples.

Methods

Figure 3:
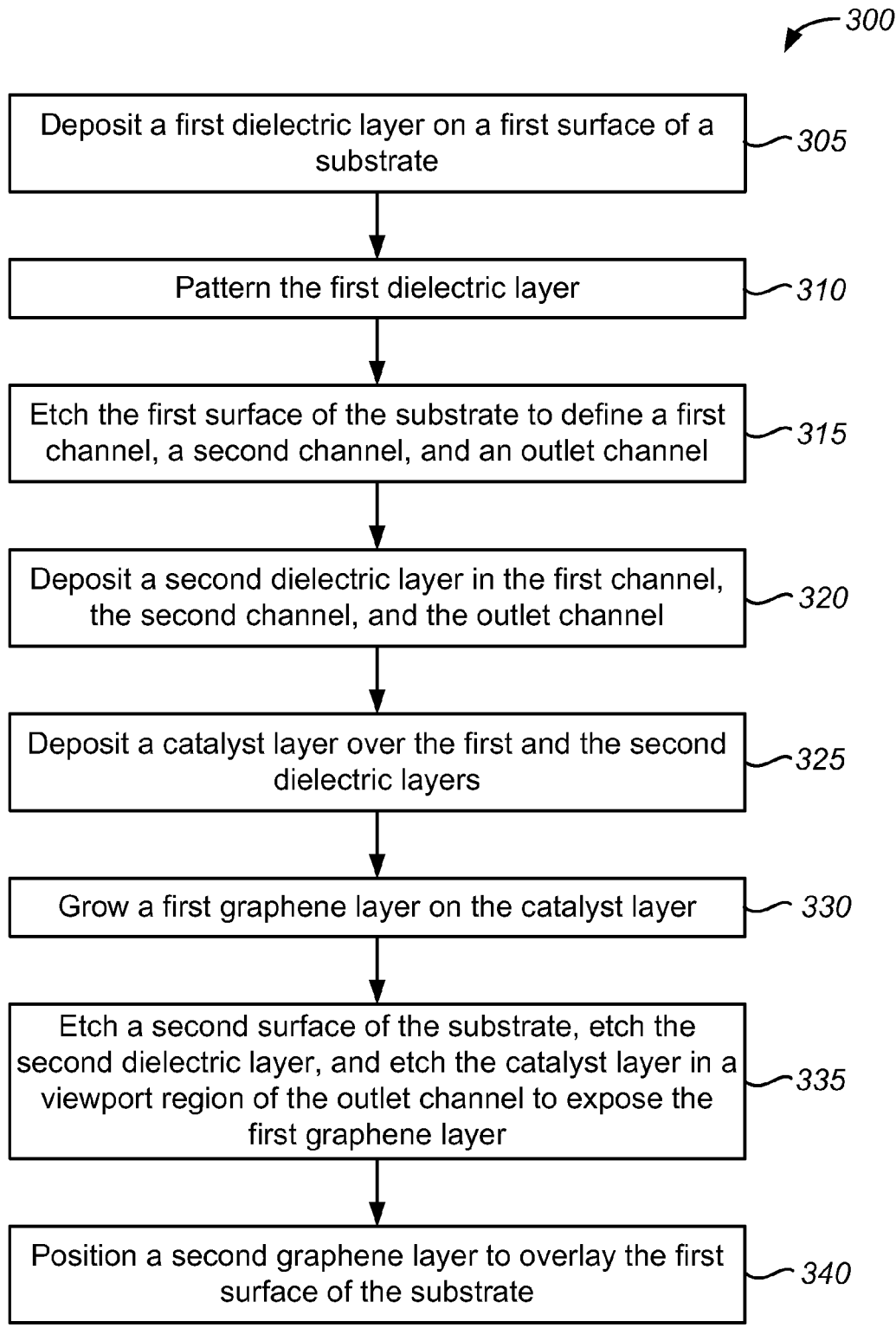
FIG. 3 shows an example of a flow diagram illustrating a manufacturing process for a TEM cell.

FIG. 3 shows an example of a flow diagram illustrating a manufacturing process for a TEM cell. FIGS. 4A-4E show examples of cross-sectional schematic illustrations of a TEM cell at various stages in the manufacturing process. The cross-sectional schematic illustrations of the TEM cell shown in FIGS. 4A-4E are of a viewport region of the TEM cell. The method 300 shown in FIG. 3 may be used to fabricate TEM cells having a number of different configurations. For example, the method 300 could be used to fabricate the TEM cell 100 shown in FIGS. 1 and 2.

Starting at block 305 of the method 300 shown in FIG. 3, a first dielectric layer is deposited on a first surface of a substrate. In some embodiments, the substrate comprises a semiconductor substrate. In some embodiments, the substrate comprises a silicon (Si) substrate. In some embodiments, the substrate is about 200 microns to 3 mm thick, or about 500 microns thick. The substrate may also comprise other materials, such as a glass, quartz, or another material that can be subjected to elevated temperatures, for example.

The first dielectric layer may be deposited using a number of different processes. In some embodiments, the first dielectric layer is deposited using an atomic layer deposition (ALD) process, a chemical vapor deposition (CVD) process, a physical vapor deposition (PVD) process, or a thermal growth process. In some embodiments, the first dielectric layer comprises silicon nitride ($Si_3N_4$), silicon oxide ($SiO_2$), or alumina ($Al_2O_3$). In some embodiments, the first dielectric layer is about 5 nm to 500 nm thick.

At block 310 of the method 300, the first dielectric layer is patterned. Patterning the first dielectric layer may serve to define where the channels, including the viewport region, of the TEM cell will be located. In some embodiments, patterning includes masking as well as etching processes, and is used to remove a portion of the first dielectric layer.

At block 315 of the method 300, the first surface of the substrate is etched to define a first channel, a second channel, and an outlet channel. The substrate may be etched in regions where the first dielectric layer has been removed from the substrate at block 310. In some embodiments, the etching process may be an isotropic etching process. In some embodiments, the etching process may be a dry etching process, such as reactive-ion etching (RIE), for example. The etchant used at block 315 may depend upon the material of the substrate. For example, when the substrate comprises silicon or other semiconductor material, the etching process (e.g., RIE) may use xenon difluoride ($XeF_2$), carbon tetrafluoride ($CF_4$), or sulfur hexafluoride ($SF_6$). In some embodiments, the etching process may etch channels with substantially circular cross-sections in the substrate.

Figure 4A:
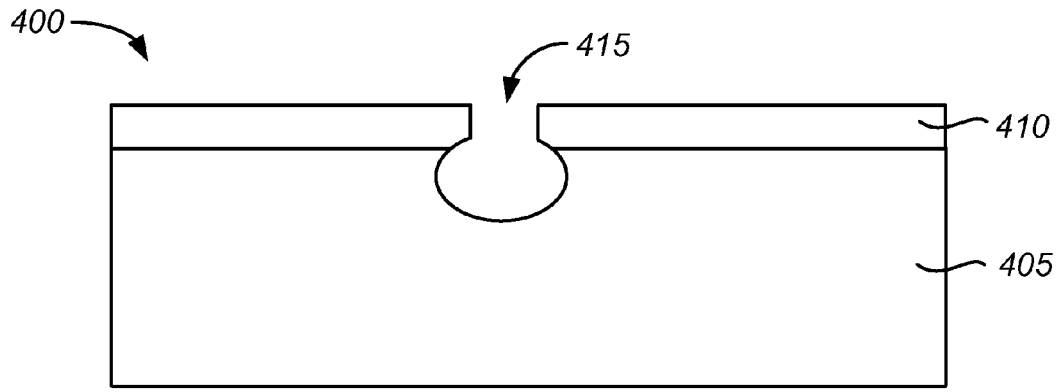
FIGS. 4A-4E show examples of cross-sectional schematic illustrations of a TEM cell at various stages in the manufacturing process.

FIG. 4A shows an example of a cross-sectional schematic illustration of the partially fabricated TEM cell at this point (e.g., up through block 315) in the method 300. The TEM cell 400 includes a substrate 405, a first dielectric layer 410 disposed on a first surface of the substrate 405, and a channel 415 etched in the substrate 405. The channel 415 includes an opening in the first dielectric layer 410. In some embodiments, a width of the channel 415 as defined in the first dielectric layer 410 or a dimension of the opening substantially parallel to the surface of the first dielectric layer 410 is about 1 micron or less.

Returning to FIG. 3, at block 320 of the method 300, a second dielectric layer is deposited in the first channel, the second channel, and the outlet channel. In some embodiments, the second dielectric layer is deposited using an ALD process, a CVD process, an e-beam evaporation process, a sputtering process, or a PVD process. In some embodiments, the second dielectric layer comprises silicon nitride, silicon oxide, or alumina. In some embodiments, the second dielectric layer is about 5 nm to 500 nm thick. In some embodiments, the second dielectric layer comprises the same material as the first dielectric layer. In some embodiments, the second dielectric layer is also deposited on the first dielectric layer.

Figure 4B:
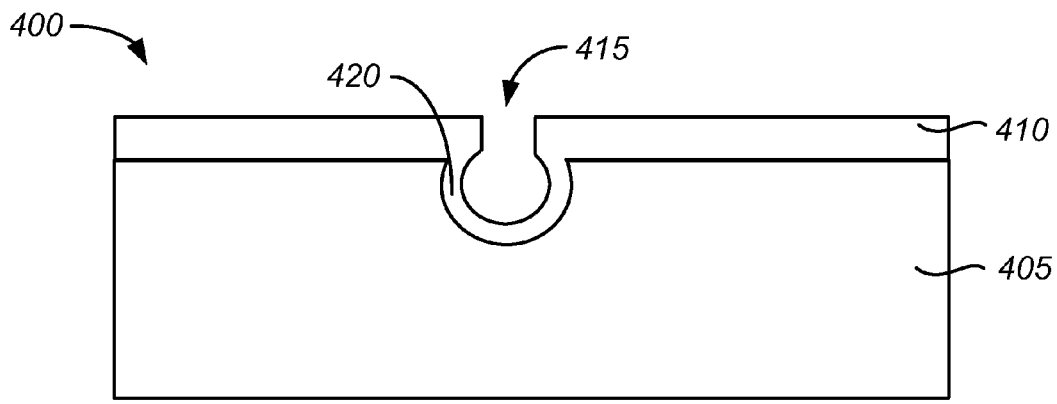

FIG. 4B shows an example of a cross-sectional schematic illustration of the partially fabricated TEM cell 400 at this point (e.g., up through block 320) in the method 300. The TEM cell 400 includes the substrate 405, the first dielectric layer 410 disposed on a first surface of the substrate 405, the channel 415 etched in the substrate 405, and a second dielectric layer 420 disposed in the channel 415. The channel 415 still includes an opening in the first dielectric layer 410.

Returning to FIG. 3, at block 325 of the method 300, a catalyst layer is deposited over the first and the second dielectric layers. In some embodiments, the catalyst layer is deposited using an ALD process, a CVD process, an e-beam evaporation process, a sputtering process, an electrochemical deposition process, or a PVD process. In some embodiments, the catalyst layer comprises copper (Cu) or nickel (Ni). In some embodiments, when the catalyst layer comprises copper, the catalyst layer is about 250 nm to 500 nm thick. In some embodiments, when the catalyst layer comprises nickel, the catalyst layer is at least about 300 nm thick. In some embodiments, the catalyst layer is annealed at about 600° C. to 900° C. before block 330.

Figure 4C:
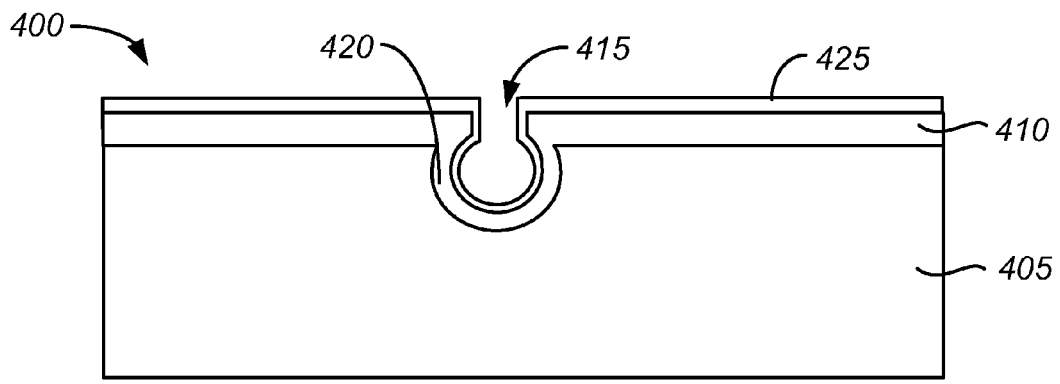

FIG. 4C shows an example of a cross-sectional schematic illustration of the partially fabricated TEM cell 400 at this point (e.g., up through block 325) in the method 300. The TEM cell 400 includes the substrate 405, the first dielectric layer 410 disposed on the first surface of the substrate 405, the channel 415 etched in the substrate 405, the second dielectric layer 420 disposed in the channel 415, and a catalyst layer 425 disposed on the first dielectric layer 410 and the second dielectric layer 420. The channel 415 includes an opening in the first dielectric layer 410 and the catalyst layer 425. In some embodiments, the thicknesses of the first dielectric layer 410 and the catalyst layer 425 are specified so that the opening is small (e.g., so that the second graphene layer positioned over the channel at block 340 is not under a large amount of mechanical stress), but still large enough so that the TEM cell 400 allows for an electron beam to be projected through the TEM cell and interact with the graphene layers and a liquid sample.

Returning to FIG. 3, at block 330 of the method 300, a first graphene layer is grown on the catalyst layer. The opening in the first dielectric layer and the catalyst layer of the channel allow for the first graphene layer to be grown on the interior surfaces of the channel. The first graphene layer may be grown using a number of different techniques, as known by one of ordinary skill in the art. For example, in some embodiments, the first graphene layer is grown using a CVD process or a plasma enhanced chemical vapor deposition (PECVD) process. In some embodiments, the precursor used in the graphene growth process is methane or acetylene. In some embodiments, the process temperature during the graphene growth process is about 900° C. to 1020° C., and the process pressure is about 50 millitorr (mtorr) to 150 mtorr, or about 100 mtorr. In some embodiments, the first graphene layer has a thickness of about an atomic layer of carbon. In some embodiments, the first graphene layer has a thickness of about an atomic layer (e.g., for a single atomic layer of carbon) to 100 nm (e.g., for a multilayer graphene sheet). In some embodiments, the first graphene layer comprises a single graphene layer. In some embodiments, the first graphene layer comprises a multilayer graphene layer. In some embodiments, after the first graphene layer is grown, it is annealed for about 2 minutes to 15 minutes. The annealing process may aid in preventing the graphene from oxidizing.

At block 335 of the method 300, a second surface of the substrate is etched, the second dielectric layer is etched, and the catalyst layer is etched. The second dielectric layer that is etched is the second dielectric layer that is exposed after the second surface of the substrate is etched. The catalyst layer that is etched is the catalyst layer that is exposed after the second dielectric layer etched. These etching processes are performed in a viewport region of the outlet channel to expose the first graphene layer from the second surface of the substrate. Each of the layers may be etched with an appropriate etching process and an appropriate etchant.

In some embodiments, the second surface of the substrate is etched with a dry etching process, such as plasma etching (e.g., reactive-ion etching). In some embodiments, the second dielectric layer serves as an etch stop when the second surface of the substrate is being etched. In some embodiments, the second dielectric layer is etched with a wet etching process, with the catalyst layer serving as an etch stop. For example, hydrofluoric acid (HF) may be used to etch the second dielectric layer, depending on the material of the second dielectric layer. In some embodiments, the catalyst layer is etched with a wet etching process, with the first graphene layer serving as an etch stop.

Figure 4D:
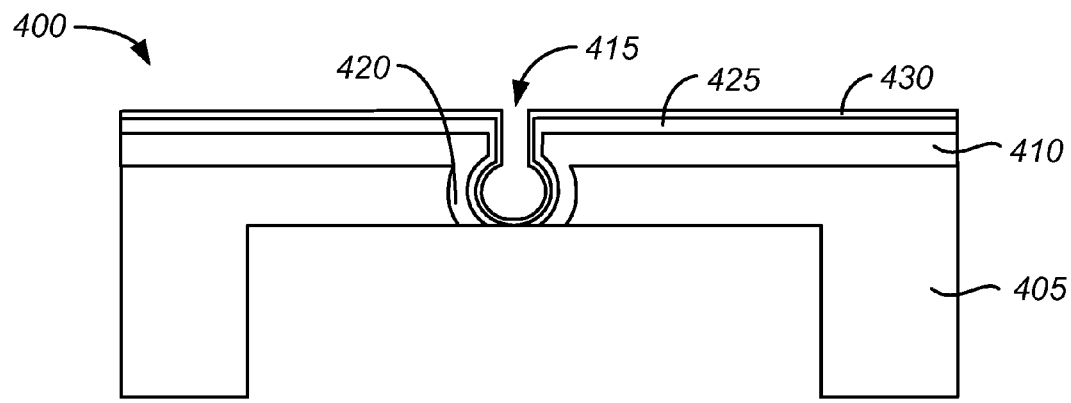

FIG. 4D shows an example of a cross-sectional schematic illustration of the partially fabricated TEM cell 400 at this point (e.g., up through block 335) in the method 300. The TEM cell 400 includes the substrate 405, the first dielectric layer 410 disposed on the first surface of the substrate 405, the channel 415 etched in the substrate 405, the second dielectric layer 420 disposed in the channel 415, the catalyst layer 425 disposed on the first dielectric layer 410 and the second dielectric layer 420, and a first graphene layer 430 disposed on the catalyst layer 425. A second side of substrate 405, including the second dielectric layer 420 and the catalyst layer 425, has been etched so that the bottom of the channel 415 is defined by the first graphene layer 430. This portion of the channel 415 will be the viewport region of the TEM cell 400.

Returning to FIG. 3, at block 340 of the method 300, a second graphene layer is positioned to overlay the first surface of the substrate. The first graphene layer and the second graphene layer define an open volume in the first channel, the second channel, and the outlet channel between the first and the second graphene layers. The second graphene layer may be fabricated using a number of different techniques, as known by one of ordinary skill in the art, and then positioned on the first surface of the substrate. For example, the second graphene layer can be grown on a new substrate, removed from the new substrate, and then positioned on the first surface of the substrate of the TEM cell. In some embodiments, the second graphene layer has a thickness of about an atomic layer of carbon. In some embodiments, the second graphene layer has a thickness of about an atomic layer to 100 nm. In some embodiments, the second graphene layer comprises a single graphene layer. In some embodiments, the second graphene layer comprises a multilayer graphene layer.

Figure 4E:
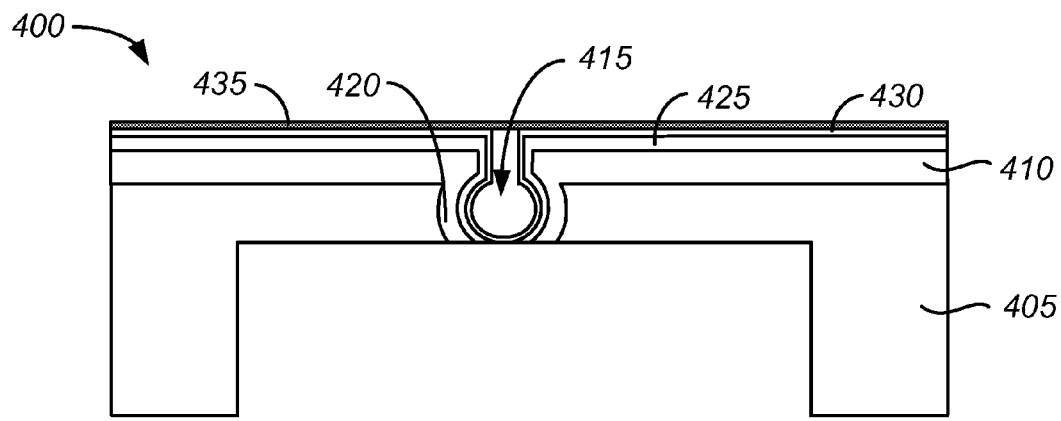

FIG. 4E shows an example of a cross-sectional schematic illustration of the fabricated TEM cell 400 at this point (e.g., up through block 340) in the method 300. The TEM cell 400 includes the substrate 405, the first dielectric layer 410 disposed on the first surface of the substrate 405, the channel 415 etched in the substrate 405, the second dielectric layer 420 disposed in the channel 415, the catalyst layer 425 disposed on the first dielectric layer 410 and the second dielectric layer 420, the first graphene layer 430 disposed on the catalyst layer 425, and a second graphene layer 435 overlaying the first surface of the substrate 405, disposed on the first graphene layer 430.

The first graphene layer 430 and the second graphene layer 435 define an open volume in the channel 415. Graphene layers generally adhere well to one another; the second graphene layer 435 and the first graphene layer 430 disposed over the first surface of the substrate 405 may from a strong bond between the two layers. In some embodiments, the bond between the first graphene layer 430 and the second graphene layer 435 may not be permeable to liquids, so that liquids may flow into inlet channels of the TEM 400 cell and out of outlet channels of the TEM cell 400, but not leak or flow from the viewport region of the first surface or the second surface of the TEM cell 400.

In some embodiments, before block 325, a buffer layer is deposited on the first and the second dielectric layers, and the catalyst layer is deposited on the buffer layer at block 325. When a buffer layer is deposited before block 325, the buffer layer is etched after block 335 so that the bottom of the channel is defined by the first graphene layer. In some embodiments, the buffer layer may aid in preventing the catalyst layer from forming silicides. In some embodiments, the buffer layer may be deposited with a PVD process, such as sputtering, for example. In some embodiments, the buffer layer comprises alumina. In some embodiments, the buffer layer is about 2.5 nm to 7.5 nm thick, or about 5 nm thick.

In some embodiments, after block 325, a top layer is deposited on the second graphene layer. In some embodiments, the top layer is a dielectric material, a metal oxide, or a metal. In some embodiments, the top layer is deposited using an evaporation process or an electroplating process. The top layer may aid in improving the bonding between the first graphene layer and the second graphene layer and also strengthen the second graphene layer against stresses and strains (e.g., the second graphene layer may be stressed due to liquids in the channels). In some embodiments, the top layer is not deposited over the viewport region, leaving the viewport region exposed.

CONCLUSION

Embodiments disclosed herein may allow scientists to observe reactions at atomic resolution, which is not possible today. Current technologies allow a scientist to monitor reactions in certain cases, but the resolution may be compromised due to the thickness of membranes (generally about 20 nm to 50 nm), whereas the devices disclosed herein employ a layer of carbon (i.e., graphene) as the viewport, allowing for increases in the resolution in a TEM.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A device comprising:
a substrate having a first surface and a second surface, a first channel, a second channel, and an outlet channel defined in the first surface of the substrate, the first channel and the second channel being joined to the outlet channel, the outlet channel proximate the first channel and the second channel defining a viewport region forming a through hole in the substrate;
a first graphene layer overlaying the first surface of the substrate, including surfaces of the first channel, the second channel, and the outlet channel; and
a second graphene layer overlaying the viewport region of the first surface of the substrate and open regions defined by the first channel, the second channel, and the outlet channel, the first graphene layer and the second graphene layer defining an open volume in the first channel, the second channel, and the outlet channel between the first and the second graphene layers.

2. The device of claim 1, wherein the first channel includes a first inlet for a flow of a first liquid to the device, wherein the second channel includes a second inlet for a flow of a second liquid to the device, and wherein the outlet channel includes an outlet for a flow of a mixture of the first liquid and the second liquid from the device.

3. The device of claim 1, wherein dimensions of the viewport region allow the first graphene layer and the second graphene layer to be mechanically stable.

4. The device of claim 1, wherein a dielectric layer is disposed on the first surface of the substrate, including the surfaces of the first channel, the second channel, and the outlet channel.

5. The device of claim 4, wherein the dielectric layer is selected from a group consisting of silicon dioxide, silicon nitride, and aluminum oxide.

6. The device of claim 4, wherein the dielectric layer is about 5 nanometers to 500 nanometers thick.

7. The device of claim 4, wherein a catalyst layer overlays the dielectric layer.

8. The device of claim 7, wherein the catalyst layer comprises copper and is about 250 nanometers to 500 nanometers thick.

9. The device of claim 7, wherein the catalyst layer comprises nickel and is at least about 300 nanometers thick.

10. The device of claim 4, wherein a buffer layer is disposed on the dielectric layer, and wherein a catalyst layer is disposed on the buffer layer.

11. The device of claim 10, wherein the buffer layer comprises alumina.

12. The device of claim 1, wherein the substrate comprises a semiconductor substrate.

13. The device of claim 1, wherein the first channel, the second channel, and the outlet channel have cross-sectional dimensions of about 10 nanometers to 100 microns.

14. The device of claim 1, wherein the through hole in the substrate has dimensions of about 250 nanometers to 750 nanometers.

15. A device comprising:
a substrate having a first surface and a second surface, a first channel and an outlet channel defined in the first surface of the substrate, the first channel being joined to the outlet channel, the outlet channel proximate the first channel defining a viewport region forming through hole in the substrate;
a first graphene layer overlaying the first surface of the substrate, including surfaces of the first channel and the outlet channel; and
a second graphene layer overlaying the viewport region of the first surface of the substrate and open regions defined by the first channel and the outlet channel, the first graphene layer and the second graphene layer defining an open volume in the first channel and the outlet channel between the first and the second graphene layers.

16. The device of claim 15, wherein the first channel includes a first inlet for a flow of a liquid to the device, and wherein the outlet channel includes an outlet for a flow of the liquid from the device.

17. The device of claim 1, wherein the first channel is operable to direct a first liquid to the viewport region, wherein the second channel is operable to direct a second liquid to the viewport region, wherein the outlet channel is operable to accept a mixture of the first liquid and the second liquid from the viewport region, and wherein the first graphene layer and the second graphene layer are operable to prevent liquids from flowing to or from the viewport region except through the first channel, the second channel, and the outlet channel.

18. The device of claim 15, wherein the first channel is operable to direct a flow of a liquid to the viewport region, wherein the outlet channel is operable to accept the flow of the liquid from the viewport region, and wherein the first graphene layer and the second graphene layer are operable to prevent liquid from flowing to or from the viewport region except through the first channel and the outlet channel.

19. The device of claim 15, wherein a dielectric layer is disposed on the first surface of the substrate, including the surfaces of the first channel and the outlet channel.

20. A device comprising:
a substrate having a first surface and a second surface, a first channel, a second channel, and an outlet channel defined in the first surface of the substrate, the first channel and the second channel being joined to the outlet channel, the outlet channel proximate the first channel and the second channel defining a viewport region forming a through hole in the substrate;
a first graphene layer overlaying the first surface of the substrate, including surfaces of the first channel, the second channel, and the outlet channel; and
a second graphene layer overlaying the viewport region of the first surface of the substrate and open regions defined by the first channel, the second channel, and the outlet channel, the first graphene layer and the second graphene layer defining an open volume in the first channel, the second channel, and the outlet channel between the first and the second graphene layers, the first channel operable to direct a first liquid to the viewport region, the second channel operable to direct a second liquid to the viewport region, the outlet channel operable to accept a mixture of the first liquid and the second liquid from the viewport region, and the first graphene layer and the second graphene layer operable to prevent liquids from flowing to or from the viewport region except through the first channel, the second channel, and the outlet channel.

* * * * *